United States Patent
Yata et al.

(10) Patent No.: US 7,053,733 B2
(45) Date of Patent: May 30, 2006

(54) SURFACE ACOUSTIC WAVE APPARATUS

(75) Inventors: Masaru Yata, Ishikawa-ken (JP); Yoichi Sawada, Ishikawa-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 236 days.

(21) Appl. No.: 10/271,777

(22) Filed: Oct. 17, 2002

(65) Prior Publication Data

US 2003/0085778 A1   May 8, 2003

(30) Foreign Application Priority Data

Oct. 17, 2001 (JP) .............................. 2001-319836

(51) Int. Cl.
   *H03B 9/64* (2006.01)
(52) U.S. Cl. .................. 333/195; 333/193; 310/313 B
(58) Field of Classification Search ........ 333/193–196, 333/133; 310/313 B, 313 D
   See application file for complete search history.

(56) References Cited

U.S. PATENT DOCUMENTS 5,994,980 A * 11/1999 Tada ........................ 333/193
6,667,673 B1   12/2003 Strauss ..................... 333/195
6,791,437 B1 *  9/2004 Hagn et al. ................ 333/195
2001/0013815 A1 *  8/2001 Sawada .................... 333/133
2001/0043024 A1 * 11/2001 Takamine et al. ....... 310/313 B

FOREIGN PATENT DOCUMENTS

| EP | 0 845 858 A2 | 6/1998 |
|---|---|---|
| JP | 10-117123 | * 5/1998 |
| JP | 10-163803 | 6/1998 |
| JP | 2003-507917 | 2/2003 |
| WO | WO 01/71911 | * 9/2001 |

* cited by examiner

*Primary Examiner*—Barbara Summons
(74) *Attorney, Agent, or Firm*—Keating & Bennett, LLP (57) ABSTRACT

A surface acoustic wave apparatus includes a piezoelectric substrate mounting a surface acoustic wave filter having a plurality of comb-like electrode sections, and another surface acoustic wave filter also having a plurality of comb-like electrode sections, in a manner such that a balun function is obtained. Further, a wiring pattern is provided on the piezoelectric substrate for a connecting reference terminal side electrode of a comb-like electrode section with a reference terminal side electrode of another comb-like electrode section. Moreover, another wiring pattern is provided on the piezoelectric substrate for connecting a reference terminal side electrode of a further comb-like electrode section with a reference terminal side electrode of a still further comb-like electrode section.

16 Claims, 12 Drawing Sheets

SURFACE ACOUSTIC WAVE APPARATUS

BACKGROUND OF THE INVENTION

1. Field of the Invention

The present invention relates to a surface acoustic wave apparatus, and more particularly, to a surface acoustic wave apparatus having a balun function.

2. Description of the Related Art

Conventionally, there has been extremely remarkable progress made in relation to some techniques for making recent cellular phones compact in size and light in weight. In order to obtain such achievements, research activity has been carried out to reduce various components as well as the size of the required components. In fact, this research activity has also attempted to develop some components each having a plurality of functions.

In view of the above, there has been active research conducted in recent years to develop an apparatus having a so-called balun function incorporated in surface acoustic wave filters for use in an RF band of a cellular phone. Particularly, the balun function has been mainly utilized in a GSM system (Global System for Mobile Communication) and other such systems. Further, there is also an extremely high possibility that the balun function can be used in AMPS, PCS, DCS and other components. Here, "balun" means a circuit for matching a balanced line such as a parallel two-wire feeder with an unbalanced line such as a coaxial cable.

Figure 12:
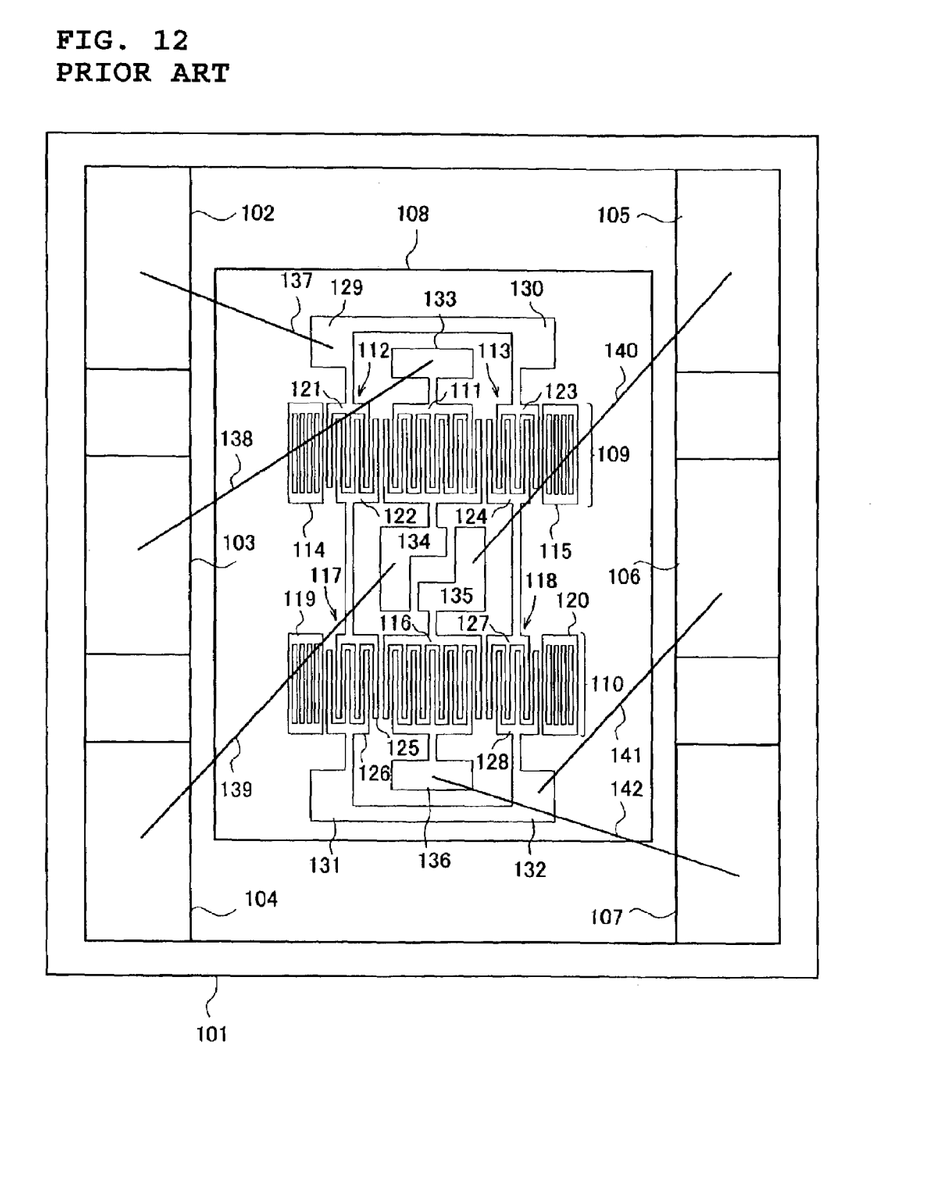
FIG. 12 is a schematic view showing a conventional surface acoustic wave apparatus.

FIG. 12 is an explanatory view showing a widely used basic constitution of a surface acoustic wave apparatus which has such a balun function and having an input impedance and an output impedance which are substantially equal to each other. An arrangement shown in FIG. 12 represents a surface acoustic wave apparatus which includes a package 101, and a piezoelectric substrate 108 included in the package. Mounted on the electric substrate 108 are two stages of longitudinally connected surface acoustic wave filters 109 and 110, belonging to a longitudinally combined resonator type, each consisting of three comb-like electrode sections (which can also be called rattan blind-like electrodes, hereinafter referred to as an IDT (Interdigital Transducer)).

The first surface acoustic wave filter 109 is a longitudinally combined resonator type surface acoustic wave filter, which includes an IDT 112 and an IDT 113 arranged respectively on the right side and the left side of a central IDT 111 (along the propagating direction of a surface acoustic wave), also includes a reflector 114 and a reflector 115 which are arranged in a manner such that the above IDTs are interposed therebetween.

The second surface acoustic wave filter 110 is constructed in exactly the same manner as the first surface acoustic wave filter 109, thereby providing an arrangement in which the two longitudinally combined resonator type surface acoustic wave filters are longitudinally connected with each other. Here, a terminal 133 is an unbalanced signal terminal, while terminals 135 and 136 are balanced signal terminals. These terminals are electrically connected with the package 101 through metal wires. The unbalanced signal terminal 133 of the longitudinally combined resonator type surface acoustic wave filter 109 on an unbalanced side, as well as a ground terminal 134, are connected with unbalanced side electrodes 103 and 104 of the package 101. On the other hand, the respective balanced signal terminals 135 and 136 of the longitudinally combined resonator type surface acoustic wave filter 110 on the balanced side, are respectively connected with balanced side electrodes 105 and 107 of the package 101.

Accordingly, a surface acoustic wave filter having a balun function is required to have a propagating characteristic that in its pass bands between the unbalanced signal terminals and the balanced signal terminals, the amplitude characteristics are as equal to one another as possible, and that the phases are reversed by as close to 180 degrees as possible. In practice, these characteristics are respectively referred to as amplitude balance and phase balance.

With respect to the amplitude balance and the phase balance, it is accepted to regard each of the above-described surface acoustic wave filters having the balun function as a three-port device. For example, when the unbalanced input terminal is assumed to be a first port, the balanced output terminals are assumed to be second and third ports respectively, while the amplitude balance and the phase balance may be defined as follows:

Amplitude balance=|A|, $A=|20 \log S21|-|20 \log S3|$;

Phase balance=|B−180 |, $B=|\angle S21-\angle S31|$

Here, S21 and S31 are matrix elements when the three-port device is expressed in a scattered matrix, respectively representing a propagating characteristic between the first port and the second port, as well as a propagating characteristic between the third port and the first port. As to such balances, it is preferable that within the pass bands of the filter, an amplitude balance is 0 dB and a phase balance is 0 degree. On the other hand, when outside the pass bands, it is preferable that the amplitude balance is 0 dB and the phase balance is 180 degree.

However, in an arrangement shown in FIG. 12, since there is a deviation between an actual value and the aforementioned ideal value, it has been very difficult to achieve the desired level of characteristics. The reason for this may be explained as follows. The shapes of the balanced signal terminal 135 and the balanced signal terminal 136 are not symmetrical with respect to each other. Moreover, since the metal wires 140 and 142 for electrically connecting the package 101 are not symmetrical with each other either with respect to their shapes and lengths, a parasitic capacitance as well as a parasitic inductance in the respective balanced signal terminals 135 and 136 are different from each other. This means the presence of a problem that a balance, particularly a balance outside the pass bands will be deteriorated, hence undesirably reducing an attenuation outside the pass bands.

SUMMARY OF THE INVENTION

In order to overcome the problems described above, preferred embodiments of the present invention provide an improved surface acoustic wave apparatus having a balun function and also significantly improving an attenuation outside the pass bands.

According to a preferred embodiment of the present invention, a surface acoustic wave apparatus includes a piezoelectric substrate, at least two longitudinally connected surface acoustic wave filters provided on the piezoelectric substrate for providing a balun function, the filters having a plurality of comb-like electrode sections arranged in the propagating direction of a surface acoustic wave, and wiring patterns provided on the piezoelectric substrate to mutually electrically connect reference terminal side electrode fingers other than electric terminal side electrode fingers provided on the comb-like electrode sections for electric signals to flow therethrough.

Preferably, in the surface acoustic wave apparatus, the respective comb-like electrode sections for use in establishing connections are electrically separated from one another on the piezoelectric substrate, and provided with electric terminal side electrode fingers and reference terminal side electrode fingers which are connected with the electrodes on the next stage. Further, the respective electric terminal side electrode fingers are electrically connected with one another on the piezoelectric substrate. Moreover, the wiring patterns are provided on the piezoelectric substrate to mutually electrically connect the respective reference terminal side electrode fingers corresponding to the respective electric terminal side electrode fingers which are electrically connected with one another.

According to the above-described arrangement, since at least two stages of surface acoustic wave filters each having several groups of IDTs arranged in the propagating direction of a surface acoustic wave are longitudinally connected, it is possible to provide a balun function.

Further, according to the above-described arrangement, since wiring patterns are provided for mutually electrically connecting the respective reference terminal side electrode fingers, it is possible to maintain the respective reference terminal side electrode fingers at the standard potential in a floated state, and to ensure a filter function as well as a balun function, without having to connect these reference terminal side electrode fingers in a grounded state.

In this way, with the use of the above-described arrangement, it is possible to dispense with several connections such as metal wires which were needed in a conventional apparatus, thereby greatly simplifying the structure of the apparatus. Further, since the provision of the wiring patterns makes it possible to alleviate a non-symmetrical connection usually caused by the above-described wire connection, it has become possible to significantly improve an attenuation outside the pass bands, as compared with the conventional apparatus.

Alternatively, in the above-described surface acoustic wave apparatus, a package for receiving the piezoelectric substrate is arranged such that at least one ground electrode is disposed between balanced signal electrodes and along the edge portions of the package. Further, a signal connecting section is provided for electrically connecting the respective balanced signal terminals on the piezoelectric substrate and the respective balanced signal terminals on the package. Moreover, a ground connecting section is provided for connecting a ground terminal of the reference terminal side electrode fingers corresponding to the comb-like electrode sections connected with unbalanced signal terminals, and the ground electrode located between the balanced signal electrodes on the package.

With the use of the above-described unique arrangement, since it is possible for the ground connecting portion to be present between the respective balanced signal connecting portions, it is possible for the ground connecting portions to provide a shield effect between the balanced signal terminals. For this reason, it becomes possible to make use of the ground connecting portions to reduce a mutual inductance of each balanced signal connecting portion, which is responsible for a balance deterioration, thereby increasing the balance and greatly improving the attenuation outside the pass bands.

Further, in the above-described surface acoustic wave apparatus, the wiring patterns on the piezoelectric substrate for mutually electrically connecting the respective reference terminal side electrode fingers corresponding to the respective electric terminal side electrode fingers electrically connected with one another, are electrically connected with the ground electrodes of the package. With the use of such an arrangement, since the wiring patterns may be electrically connected with the ground electrode of the package, a grounded state can be reinforced, thereby greatly improving an attenuation outside the pass bands.

In the above-described surface acoustic wave apparatus, it is preferable that the surface acoustic wave filters be arranged in two longitudinally connected stages. In this way, since the apparatus includes two longitudinally connected stages arranged in a miniaturized configuration, it is possible to avoid the formation of a large scale apparatus.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
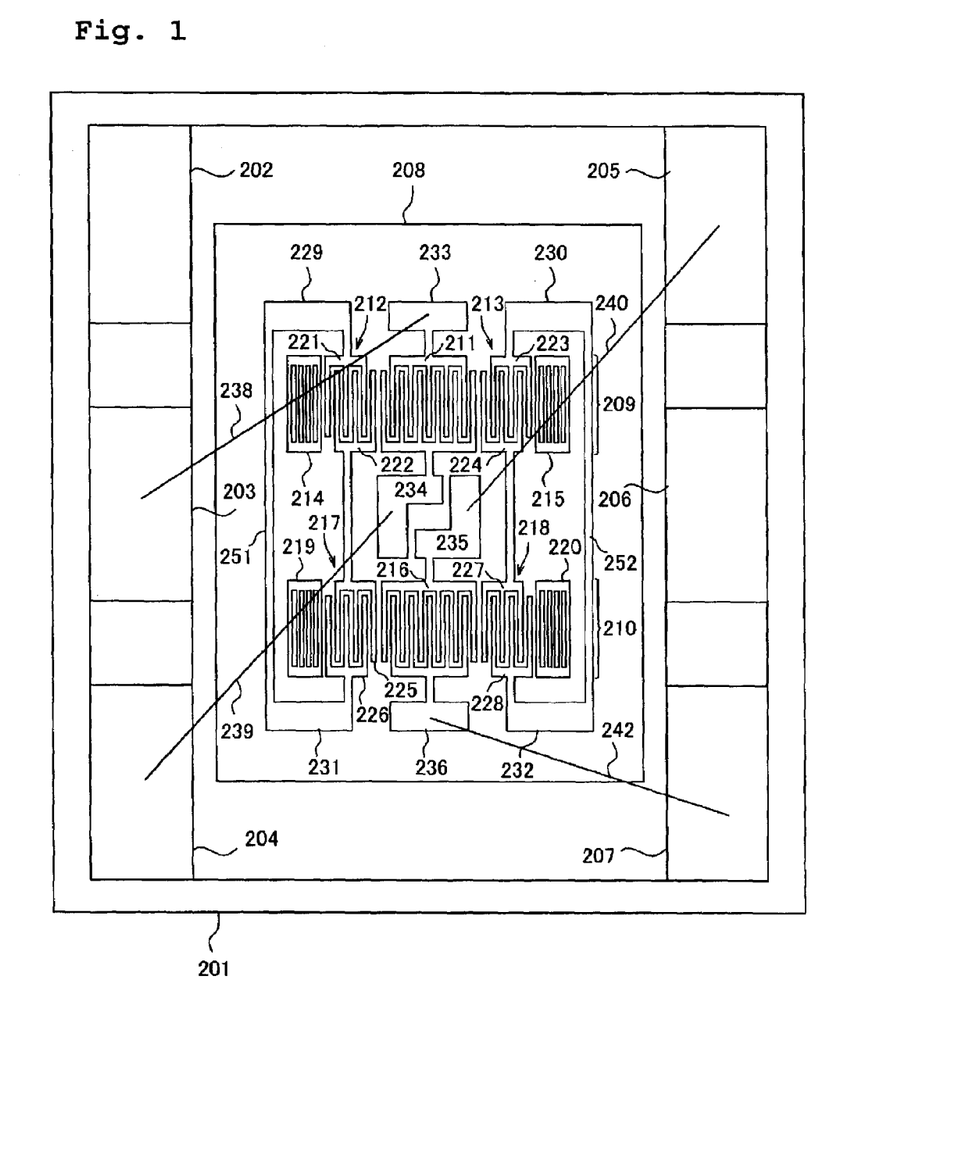
FIG. 1 is a schematic view showing a surface acoustic wave apparatus according to a first preferred embodiment of the present invention.

Several preferred embodiments of the present invention will be described in the following with reference to FIG. 1 through FIG. 11. FIG. 1 schematically shows the structure of a surface acoustic wave apparatus according to the first preferred embodiment of the present invention. However, each of the following preferred embodiments will be described using an EGSM receiving filter as an example but the present invention is not limited thereto.

In the first preferred embodiment, a first surface acoustic wave filter 209 and a second surface acoustic wave filter 210 are disposed on a piezoelectric substrate 208 which is preferably made of LiTaO$_3$ for 40±5 degree Y-cut X-propagation. In fact, these filters are preferably formed by aluminum (Al) electrodes using a photolithography method.

Here, the first surface acoustic wave filter 209 and the second surface acoustic wave filter 210 are longitudinal combination resonator type surface acoustic wave filters which have been described above, and are arranged such that each of them has three IDTs arranged in the propagating direction of a surface acoustic wave. Preferably, the first surface acoustic wave filter 209 and the second surface acoustic wave filter 210 are arranged in a manner such that their surface acoustic wave propagating directions are substantially parallel with each other, and such that the center positions of these surface acoustic wave propagating directions are substantially coincident with each other in a direction that is substantially perpendicular to the propagating direction, thereby making it easy to manufacture apparatus compact in size.

An electrode 222 on an electric terminal side in an IDT 212 of the first surface acoustic wave filter 209, is longitudinally connected with an electrode 225 on an electric terminal side in an IDT 217 of the second surface acoustic wave filter 210. Meanwhile, an electrode 224 on an electric terminal side in an IDT 213 of the first surface acoustic wave filter 209, is longitudinally connected with an electrode 227 on an electric terminal side in an IDT 218 of the second surface acoustic wave filter 210.

Here, the IDT 212 and the IDT 217 are not grounded but connected with each other in a floated state. Similarly, the IDT 213 and the IDT 218 are not grounded either, but connected with each other also in a floated state. More specifically, a wiring pattern 251 is provided for electrically connecting, on the piezoelectric substrate 208, a terminal 229 of an electrode 221 on a reference terminal side of the ITD 212 with a terminal 231 of an electrode 226 on a reference terminal side of the ITD 217. Further, another wiring pattern 252 is provided for electrically connecting, on the piezoelectric substrate 208 a terminal 230 of an electrode 223 on a reference terminal side of the ITD 213 with a terminal 232 of an electrode 228 on a reference terminal side of the ITD 218.

In practice, the respective wiring patterns 251 and 252 are preferably formed by using the aforementioned photolithography method, and are preferably arranged in symmetrical relation with each other, using a virtual line as a symmetrical axis which is substantially perpendicular to the aforementioned propagating direction in the center position of the propagating direction of the surface acoustic wave, thereby increasing the attenuation outside the pass bands.

Here, a terminal 233 of the first surface acoustic wave filter 209 is used as an unbalanced signal terminal, while a terminal 235 and a terminal 236 of the second surface acoustic wave filter 210 are used as balanced signal terminals. These balanced and unbalanced signal terminals are all connected with the electrodes of the package 201, thereby defining a surface acoustic wave apparatus having a balun function. In detail, an electrode 203 of the package 201 is an unbalanced side electrode, while an electrode 205 and an electrode 207 are balanced side electrodes, with other electrodes being ground electrodes.

In fact, a first feature of the first preferred embodiment can be described as follows. More specifically, of the connecting IDTs for longitudinally connecting the first surface acoustic wave filter 209 with the second surface acoustic wave filter 210, those IDTs (IDT 212 and IDT 213, IDT 217 and IDT 218) for use in connection in an identical surface acoustic wave filter are electrically separated from each other on the piezoelectric substrate 208.

Then, a second feature of the first preferred embodiment can be described as follows. More specifically, in the IDTs which are longitudinally connected, the reference terminals (the electrode 221 and the electrode 226, the electrode 223 and the electrode 228) corresponding to (facing) the longitudinally connected electric terminals (the electrode 222 and the electrode 225, the electrode 224 and the electrode 227) are respectively electrically connected with one another on the piezoelectric substrate 208, all through the respective wiring patterns 251 and 252.

On the other hand, in the conventional apparatus shown in FIG. 12, the reference terminals (the electrode 121 and the electrode 126, the electrode 123 and the electrode 128) corresponding to the longitudinally connected electric terminals (the electrode 122 and the electrode 125, the electrode 124 and the electrode 127) are not electrically connected with one another on the piezoelectric substrate 108. In fact, only the reference terminals (the electrode 121 and the electrode 123, the electrode 126 and the electrode 128) of the surface acoustic wave filters are electrically connected with one another on the piezoelectric substrate 108.

Further, a third feature of the first preferred embodiment can be described as follows. More specifically, the metal wires 137 and 141 required in the conventional apparatus shown in FIG. 12 can be omitted in the first preferred embodiment shown in FIG. 1, providing an advantage of reducing the metal wire. However, in order to simplify FIG. 1, the number of IDTs as well as reflectors are omitted to some extent.

The details in designing an example of a preferred embodiment of the longitudinally combined resonator type surface acoustic wave filter are as follows.

Cross width W: about 52.9 λI
The number of IDT pairs (in the order of 212, 211, 213): 11 pairs, 15 pairs, 11 pairs
IDT wavelength λI: about 4.16 μm
Reflector wavelength λR: about 4.64 μm
The number of reflectors: 120
An IDT—IDT interval: about 0.31 λI
An IDT—Reflector interval: about 0.51 λI
IDT Duty: about 0.68
Reflector Duty: about 0.50
Electrode film thickness: about 0.083 λI The operation and advantages in relation to the first preferred embodiment will be described as follows. In the conventional apparatus shown in FIG. 12, the reference terminal (the electrode 121) of the IDT 112 of the first surface acoustic wave filter 109 and the reference terminal (the electrode 123) of the IDT 113 of the first surface acoustic wave filter 109, the reference terminal (the electrode 126) of the IDT 117 of the second surface acoustic wave filter 110 and the reference terminal (the electrode 128) of the IDT 118 of the second surface acoustic wave filter 110, are electrically connected on the piezoelectric substrate 108. In such an arrangement, the reference terminals (the electrode 121, the electrode 123, the electrode 126 and the electrode 128) are required to be electrically connected with the ground electrodes of the package 101 by way of metal wires.

The reasons for the above-described unique arrangement can be explained as follows. Here, the first surface acoustic wave filter 109 is used as an input side, while the second surface acoustic wave filter 110 is used as an output side. Accordingly, in order to longitudinally connect together the two surface acoustic wave filters and thus provide a desired surface acoustic wave apparatus, it is necessary to transmit an electric signal, which is generated by a surface acoustic wave excited in the surface acoustic wave filter 109, to the surface acoustic wave filter 110.

If the metal wire 137 and the metal wire 141 are not included, the reference terminals (the electrode 121 and the electrode 126, the electrode 123 and the electrode 128) corresponding to the electrically connected electric terminals will not be electrically connected. At this time, since the potential of the reference terminals corresponding to the electrically connected electric terminals can not be determined, an electric signal generated in the first surface acoustic wave filter 109 will not be transmitted to the second surface acoustic wave filter 110. As a result, it is impossible for such an apparatus to function as a surface acoustic wave apparatus. For this reason, in a conventional apparatus shown in FIG. 12, it is necessary for the reference terminals to be grounded by way of the metal wire 137 as well as the metal wire 141.

In fact, Japanese Unexamined Patent Application Publication No. 10-163803 has disclosed an apparatus which is identical with the conventional apparatus discussed in the present specification, as shown in FIG. 10, FIG. 11, FIG. 12 and FIG. 14 of JP 10-163803.

In contrast to the above-described conventional apparatus, in the first preferred embodiment of the present invention shown in FIG. 1, the reference terminal (the electrode 221) of the IDT 212 of the first surface acoustic wave filter 209 and the reference terminal (the electrode 226) of the IDT 217 of the second surface acoustic wave filter 210, the reference terminal (the electrode 223) of the IDT 213 of the first surface acoustic wave filter 209 and the reference terminal (the electrode 228) of the IDT 218 of the second surface acoustic wave filter 210, are electrically connected on the piezoelectric substrate 208.

For this reason, various reference terminals with respect to the longitudinally electrically connected electric terminals have the same potential, so that an electric signal generated in the first surface acoustic wave filter 209 will be transmitted to the second surface acoustic wave filter 210. As a result, in the first preferred embodiment shown in FIG. 1, it is not necessary to use metal wires similar to the metal wire 137 and the metal wire 141 used in the conventional apparatus shown in FIG. 12.

Figure 5:
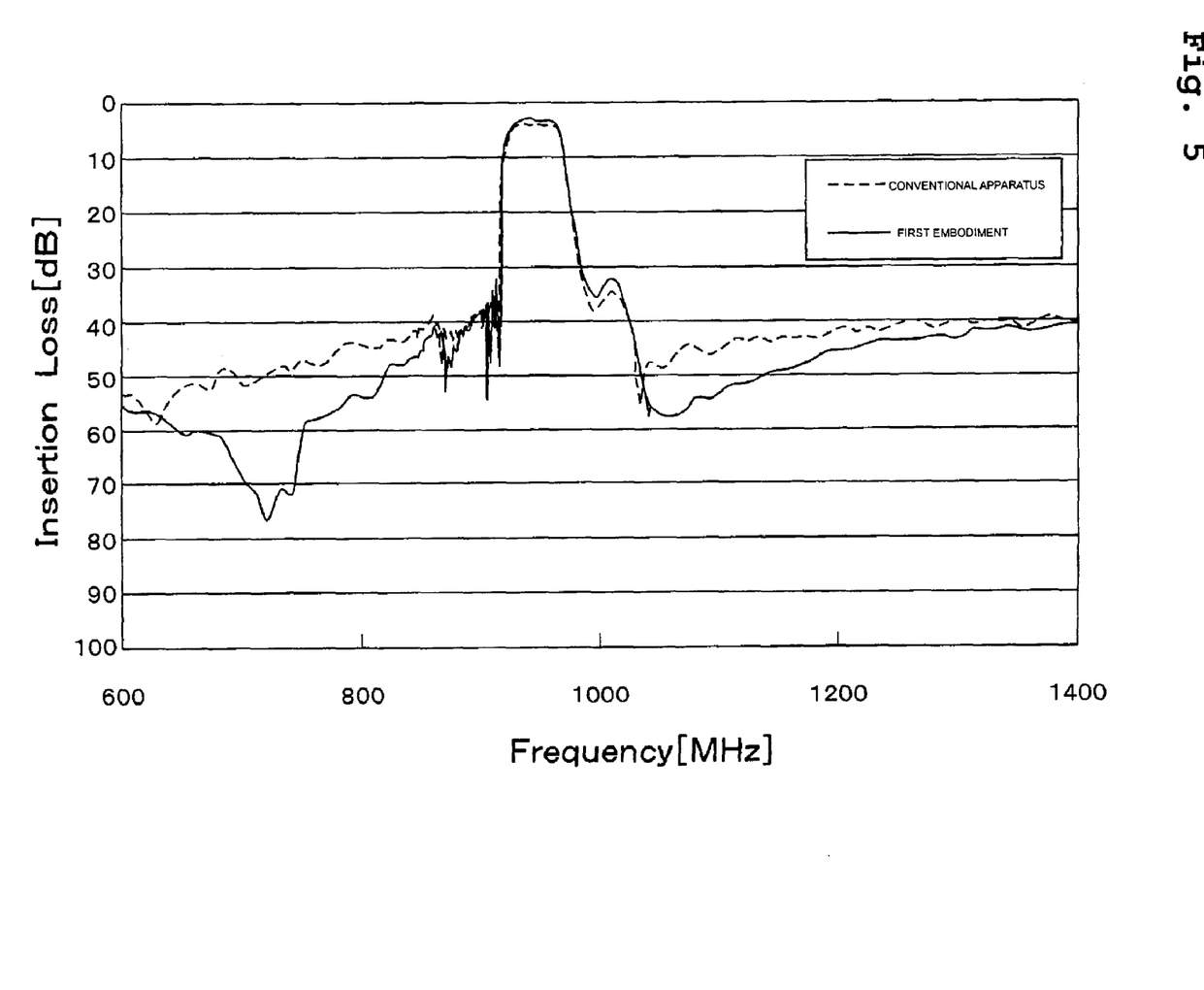
FIG. 5 is a graph showing a frequency characteristic of an insertion loss in each of the first preferred embodiment and a conventional apparatus.

The transmission characteristic of the first preferred embodiment is shown in FIG. 5. The transmission characteristic of the conventional apparatus is also shown in FIG. 5. The first preferred embodiment of the present invention differs from the above-described conventional apparatus in that various electrodes on the piezoelectric substrate in the first preferred embodiment are connected with the package through the metal wires in a different manner from that used in the conventional apparatus. However, the surface acoustic wave filters in the first preferred embodiment of the present invention are completely the same as those in the conventional apparatus.

In this way, as compared with the conventional apparatus shown in FIG. 12, the first preferred embodiment shown in FIG. 1 provides an arrangement in which two metal wires have been omitted, thereby making it possible to provide an improved surface acoustic wave apparatus having a greatly simplified structure. Further, as compared with the above conventional apparatus, the first preferred embodiment of the present invention makes it possible to obtain an advantage of increasing attenuation in the vicinity of pass bands.

Figure 2:
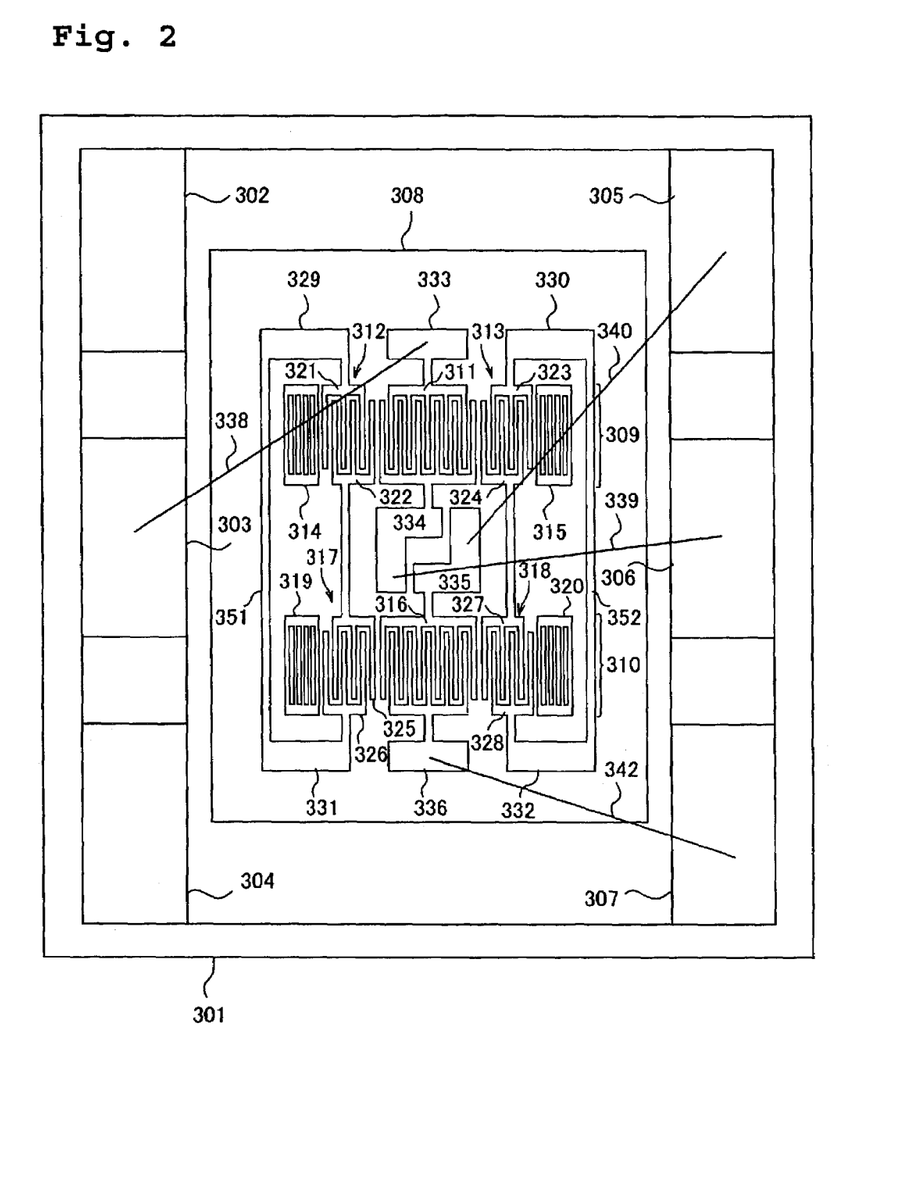
FIG. 2 is a schematic view showing a surface acoustic wave apparatus according to a second preferred embodiment of the present invention.

Next, description will be provided to explain a surface acoustic wave apparatus according to a second preferred embodiment of the present invention. FIG. 2 shows the second preferred embodiment of the present invention. In fact, the second preferred embodiment shown in FIG. 2 is almost the same as the first preferred embodiment shown in FIG. 1 except that the position of metal wire 339 is different. Therefore, the second preferred embodiment uses reference numerals that are changed, for example "200" used in the first embodiment to "300", i.e., changing only the first digit of each reference numeral, with the last two digits remaining unchanged. However, an explanation of what each reference numeral represents is omitted. Similarly, in each of the other preferred embodiments which will be described in the following, only the first digit of each reference numeral will be changed, but the last two digits remain unchanged.

Therefore, the following description will be provided to explain only the points which are different from those in the first preferred embodiment shown in FIG. 1. As described above, in the first preferred embodiment, the ground terminal 234 with respect to the unbalanced signal terminal 233 of the first surface acoustic wave filter 209 is connected with the unbalanced side ground electrode 204 of the package 201 via the metal wire 239.

On the other hand, in the second preferred embodiment shown in FIG. 2, the ground terminal 334 with respect to the unbalanced signal terminal 333 of the first surface acoustic wave filter 309 is connected with the balanced side ground electrode 306 of the package 301 via the metal wire 339.

Figure 6:
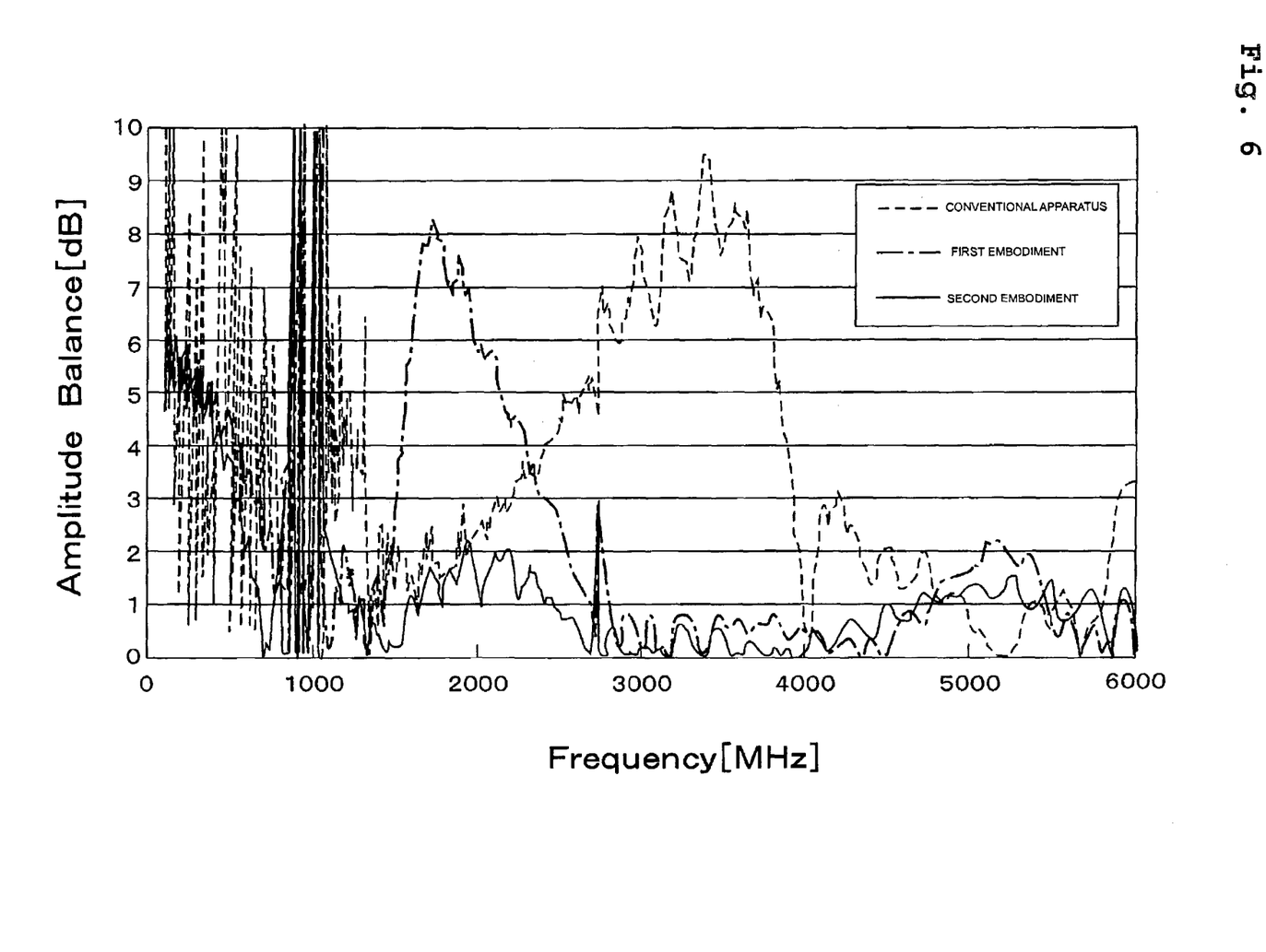
FIG. 6 is a graph showing a frequency characteristic of an amplitude balance in each of the first preferred embodiment, the second preferred embodiment and the conventional apparatus.
Figure 7:
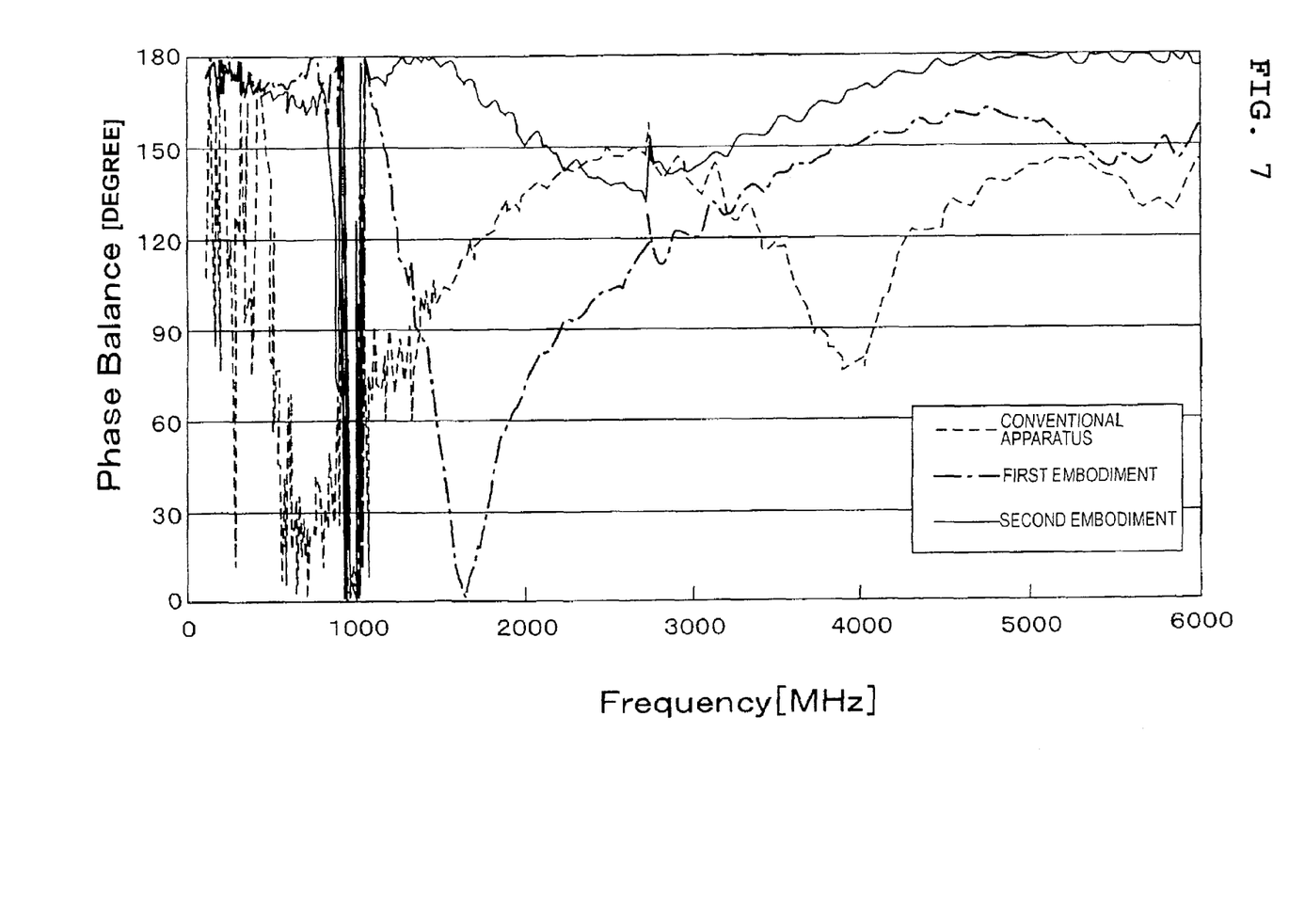
FIG. 7 is a graph showing a frequency characteristic of a phase balance in each of the first preferred embodiment and the second preferred embodiment of the present invention.
Figure 8:
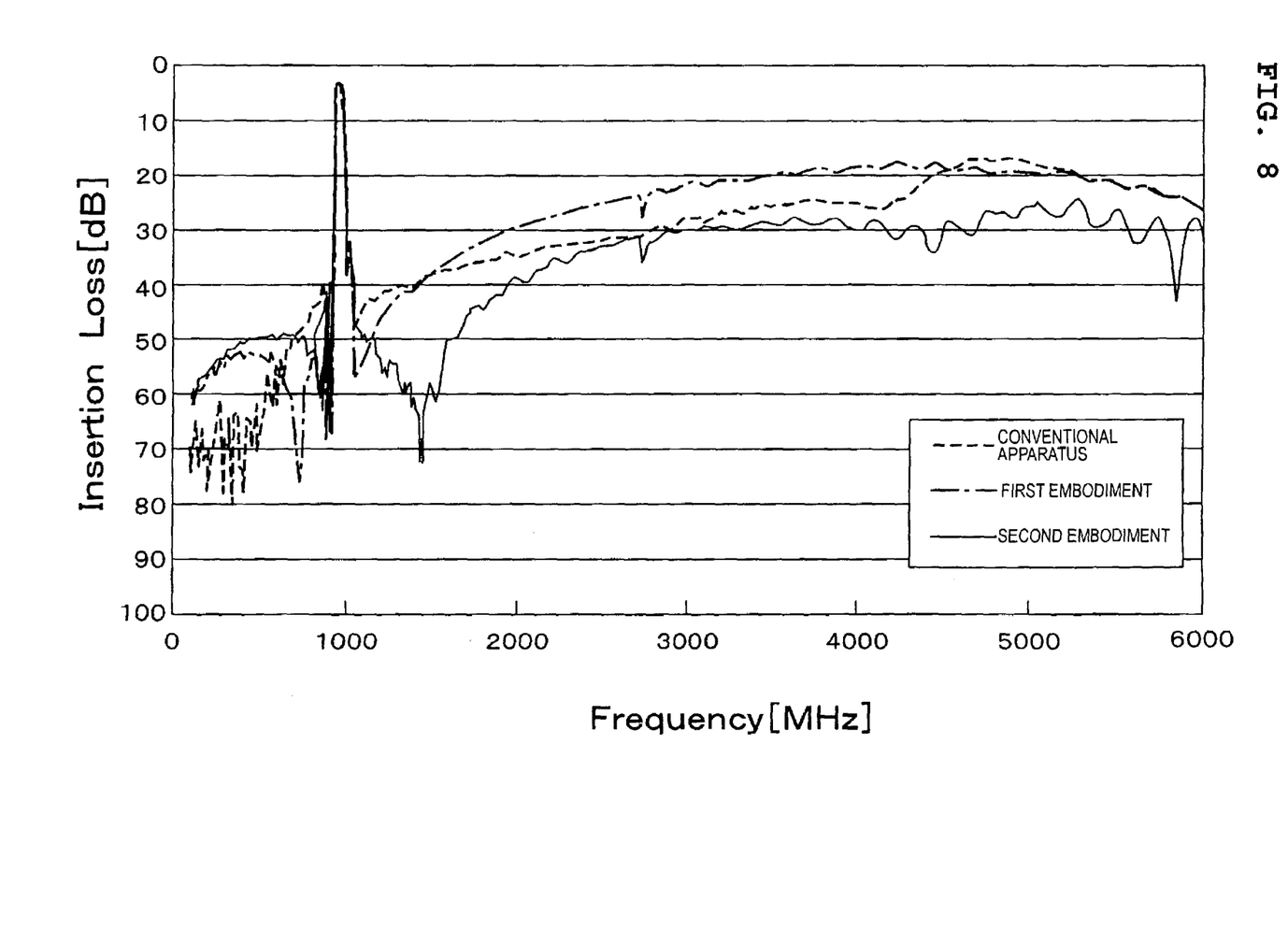
FIG. 8 is a graph showing a frequency characteristic of an insertion loss in each of the first preferred embodiment and the second preferred embodiment of the present invention.

The operation and advantages achieved by the second preferred embodiment will be described in the following. In detail, with regard to the second preferred embodiment of the present invention, its amplitude balance is shown in FIG. 6, its phase balance is shown in FIG. 7, and its attenuation is shown in FIG. 8, all in comparison with the conventional apparatus as well as with the first preferred embodiment of the present invention. As shown in FIG. 6, the first preferred embodiment indicates that an amplitude balance in a frequency band from about 1.5 GHz to about 2 GHz has a maximum value which is as high as about 8 dB, while the second preferred embodiment indicates a maximum value which is as low as about 2 dB within the same frequency band, thereby showing the improvement.

Similar results can also be seen in FIG. 7 which shows a phase balance. As compared with the first preferred embodiment, the second preferred embodiment shows that at a frequency of about 1.5 GHz or higher, its phase balance will be increased by about 20 degrees to about 30 degrees, so that it can reach about 180 degrees, thereby providing an improvement. In fact, as compared with the conventional apparatus, a considerable improvement has been achieved in amplitude balance, as well as in phase balance.

In this way, the second preferred embodiment shows that when outside the pass bands, its amplitude balance is 0 dB and its phase balance is close to 180 degrees, thereby providing a great improvement in attenuation, as shown in FIG. 8. In particular, when compared with the first preferred embodiment, at a frequency of about 1.5 GHz or higher, such an attenuation has been improved by about 10 dB. Even when compared with the conventional apparatus, particularly in the vicinity of a frequency of about 1.5 GHz which is close to a pass band, an attenuation has been improved from about 40 dB to about 60 dB.

An advantage obtained from the second preferred embodiment can be described as follows. In the first preferred embodiment shown in FIG. 1, the balanced signal terminal 235 and the balanced signal terminal 236 are not symmetrical with each other. In addition, the metal wire 240 and the metal wire 242 are not symmetrical with each other, either. For this reason, it is possible to consider that an incidental capacitance and an incidental inductance between the balanced signal terminals are different, and a mutual inductance is generated between the metal wire 240 and the metal wire 242, hence causing a deteriorated balance.

On the other hand, in the second preferred embodiment shown in FIG. 2, a metal wire 339 is provided between the metal wire 340 and the metal wire 342. Therefore, it is possible to consider that the presence of the metal wire 339 provides a shield effect between the balanced terminals, so that the mutual inductance partially responsible for a deteriorated balance has been minimized and thus the balance has been increased. Accordingly, especially outside the pass bands, an amplitude balance is close to 0 dB and a phase balance is close to 180 degrees, thereby greatly improving an attenuation outside the pass bands.

In this way, an insufficient attenuation outside the pass bands in the first preferred embodiment can be greatly improved only by making a change in the arrangement of the metal wires, without having to increase the number of the metal wires.

Figure 3:
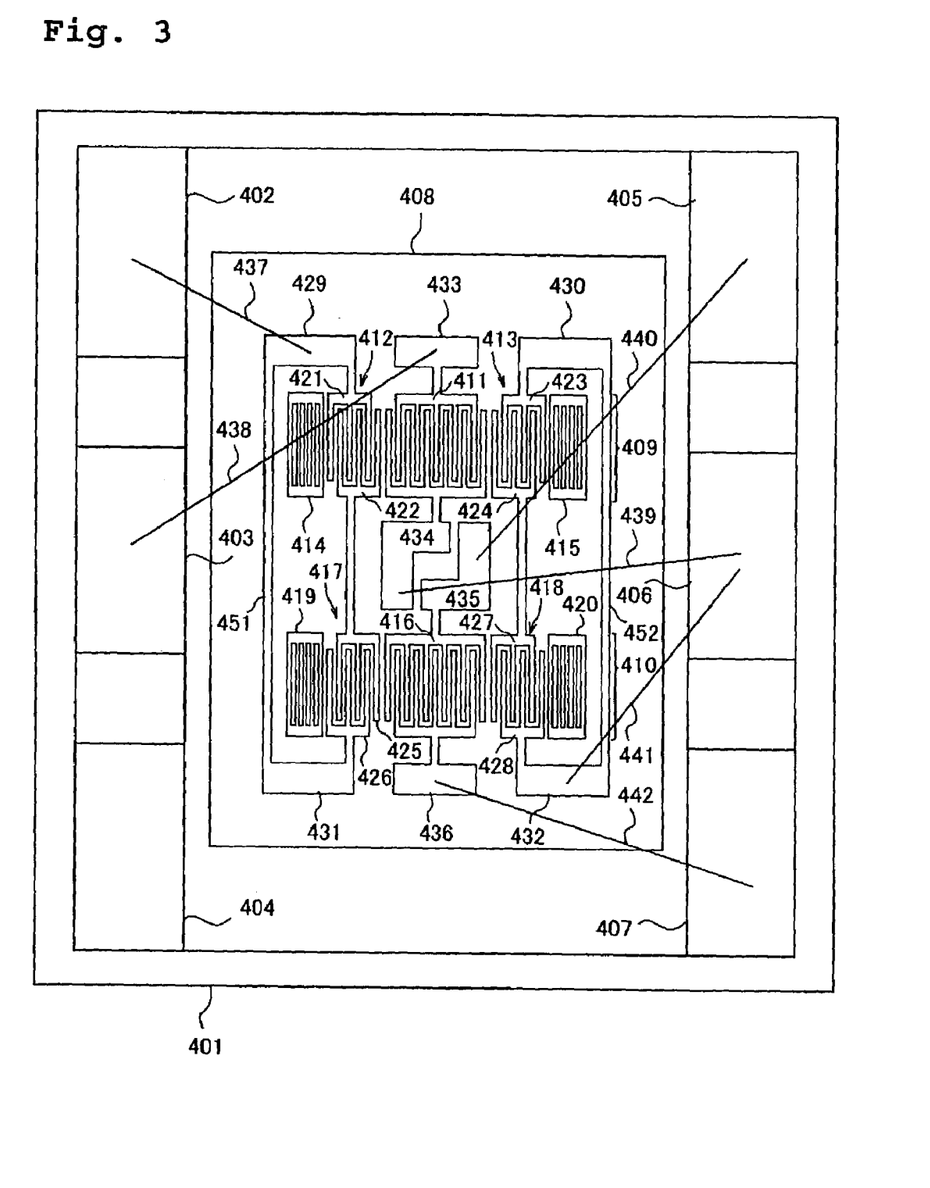
FIG. 3 is a schematic view showing a surface acoustic wave apparatus according to a third preferred embodiment of the present invention.

In the following, description will be provided to explain a surface acoustic wave apparatus according to a third preferred embodiment of the present invention. FIG. 3 shows the third preferred embodiment of the present invention. In fact, the third preferred embodiment shown in FIG. 3 is constructed as in the above-described second preferred embodiment shown in FIG. 2, adding only a metal wire 437 and a metal wire 441. Therefore, the third preferred embodiment is almost the same as the second preferred embodiment except that the number of metal wires in the third embodiment is different from that in the second preferred embodiment.

In fact, the third embodiment differs from the first and second preferred embodiments in the following points. That is, in the third preferred embodiment, a reference terminal (an electrode 421) of an IDT 412 of a first surface acoustic wave filter 409, a reference terminal (an electrode 423) of an IDT 413 of the first surface acoustic wave filter, a reference terminal (an electrode 426) of an IDT 417 of a second surface acoustic wave filter 410, a reference terminal (an electrode 428) of an IDT 418 of the second surface acoustic wave filter, are grounded through the respective wires 437, 441 as well as a package 401.

In this way, the structure shown in FIG. 3 differs from the first preferred embodiment shown in FIG. 1 and the second preferred embodiment shown in FIG. 2, in that the third preferred embodiment uses two more metal wires than the first and second preferred embodiments. However, as may be made clear in the following description, the number of metal wires used in the third preferred embodiment is just the same as the number of metal wires used in the above described conventional apparatus shown in FIG. 12.

Further, different from the conventional apparatus shown in FIG. 12, the third preferred embodiment shows that a ground terminal 434 with respect to an unbalanced signal terminal 433 of the first surface acoustic wave filter 409 is connected via a metal wire 439 to a balanced side ground electrode 406 of the package 401.

On the other hand, in the conventional apparatus shown in FIG. 12, a ground terminal 134 with respect to an unbalanced signal terminal 133 of the first surface acoustic wave filter 109 is connected via a metal wire 139 to an unbalanced side ground electrode 104 of the package 101. For this reason, the number of wires in the third preferred embodiment is just the same as that in the conventional apparatus.

Figure 9:
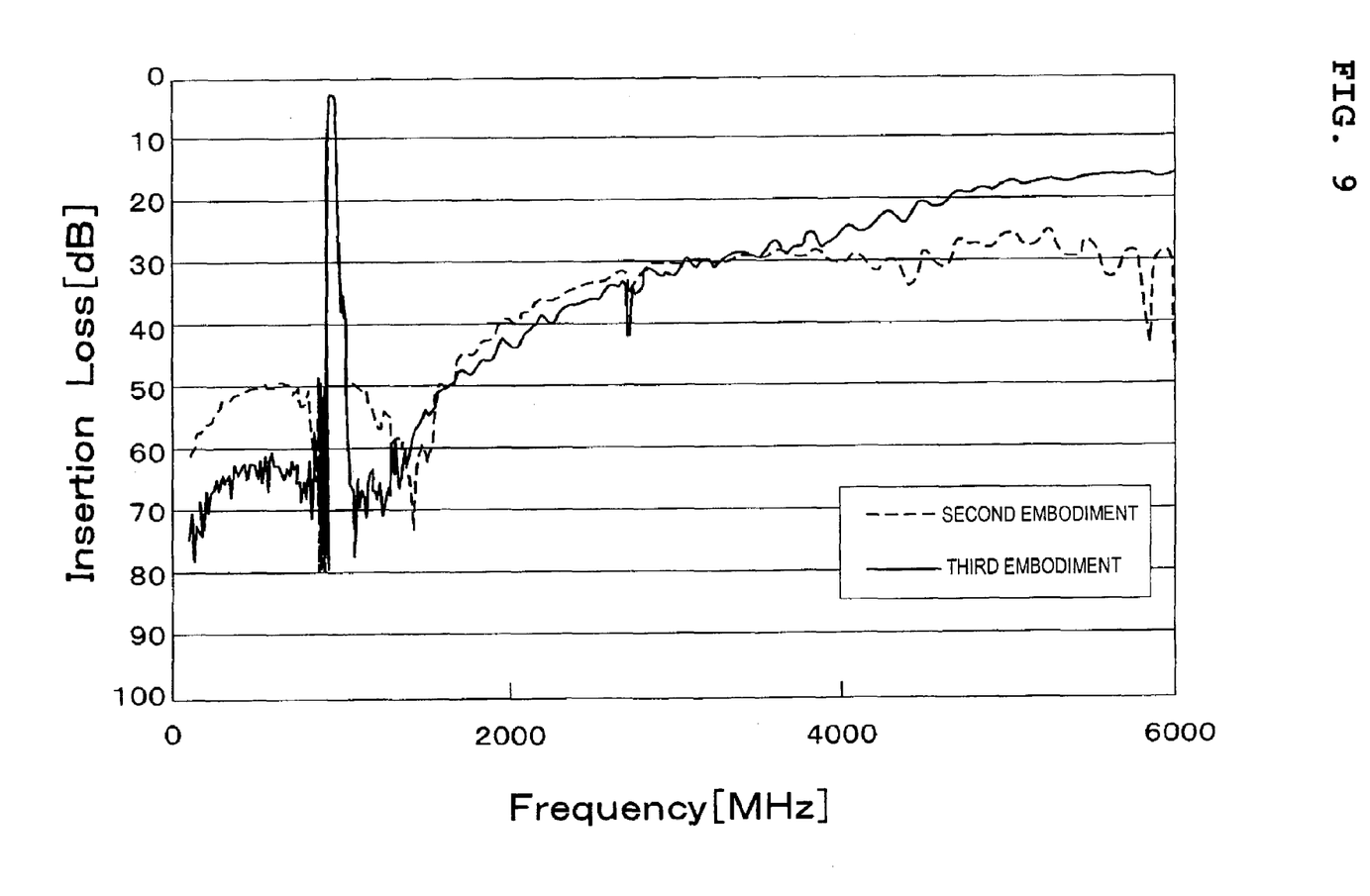
FIG. 9 is a graph showing a frequency characteristic of an insertion loss in each of the second preferred embodiment and the third preferred embodiment of the present invention.

In the following, description will be provided to explain the operation and advantage of the third preferred embodiment. FIG. 9 is a graph showing a comparison between an attenuation in the third preferred embodiment and that in the second preferred embodiment. Now, with regard to the third preferred embodiment, as may be understood from FIG. 9; in the vicinity of the pass bands and in a frequency band from about 0 MHz to about 900 MHz, as well as in a frequency band from about 1 GHz to about 1.5 GHz, the attenuation has been improved by about 10 dB to about 20 dB as compared with the second preferred embodiment. However, the reason for such an improvement may be considered as follows. More specifically, in the third preferred embodiment, since the reference terminals (the electrode 421, the electrode 423, the electrode 426 and the electrode 428) corresponding to the longitudinally connected IDT electric terminals are grounded through the metal wires 437 and 441 as well as the package 401, so that the grounding effect has been reinforced.

Figure 10:
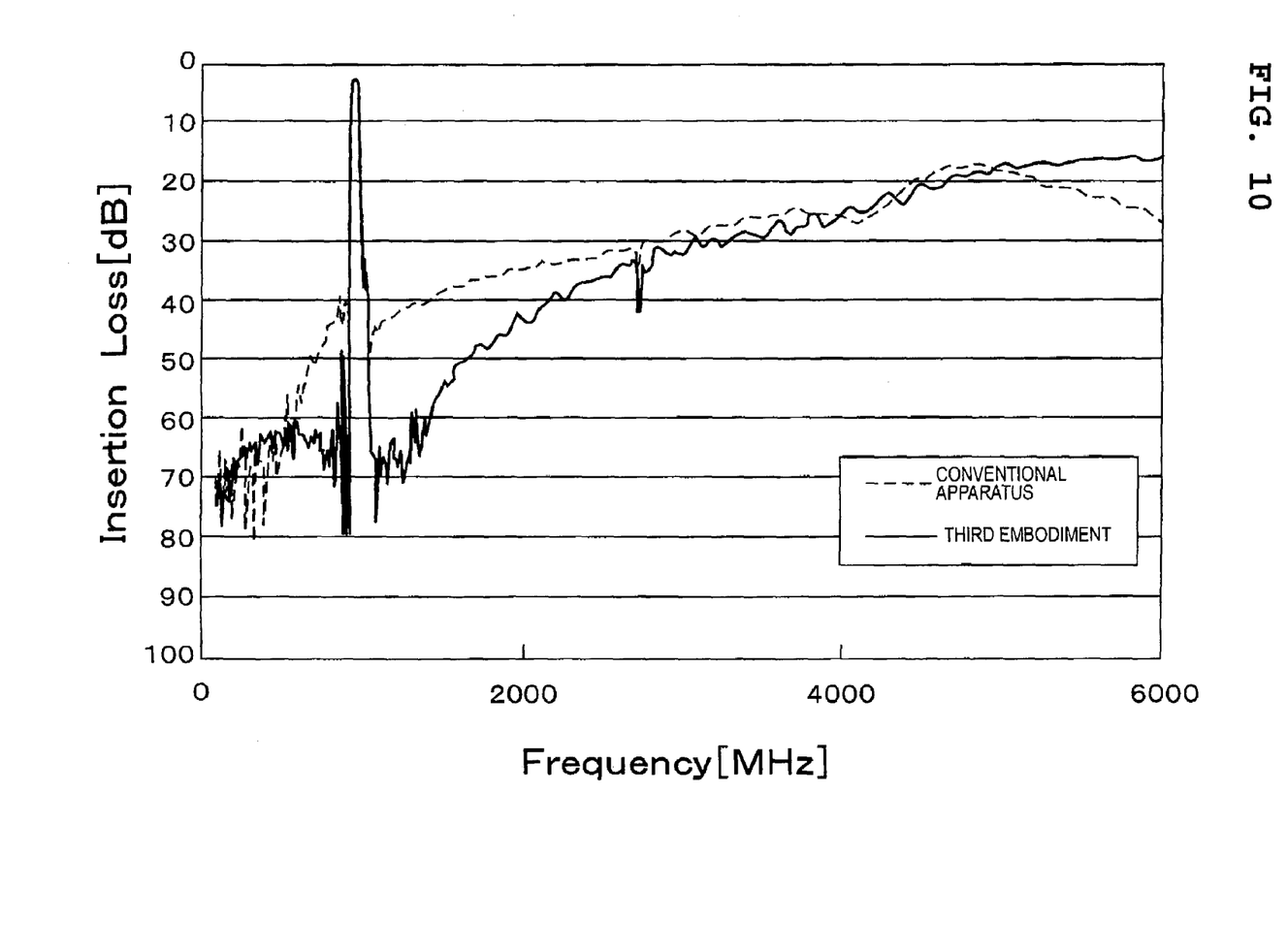
FIG. 10 is a graph showing a frequency characteristic of an insertion loss in each of the third preferred embodiment and the conventional apparatus.

FIG. 10 is a graph showing an attenuation comparison between the conventional apparatus and the third preferred embodiment. The following facts can be understood from the comparison. More specifically, a ground terminal 434 with respect to an unbalanced signal terminal 433 of the first surface acoustic wave filter 409 is connected via a metal wire 439, not to the unbalanced side ground electrode 404 of the package 401, but to the balanced side ground electrode 406 of the package 401, thereby greatly improving the attenuation in a frequency band not within but close to the pass bands.

Figure 4:
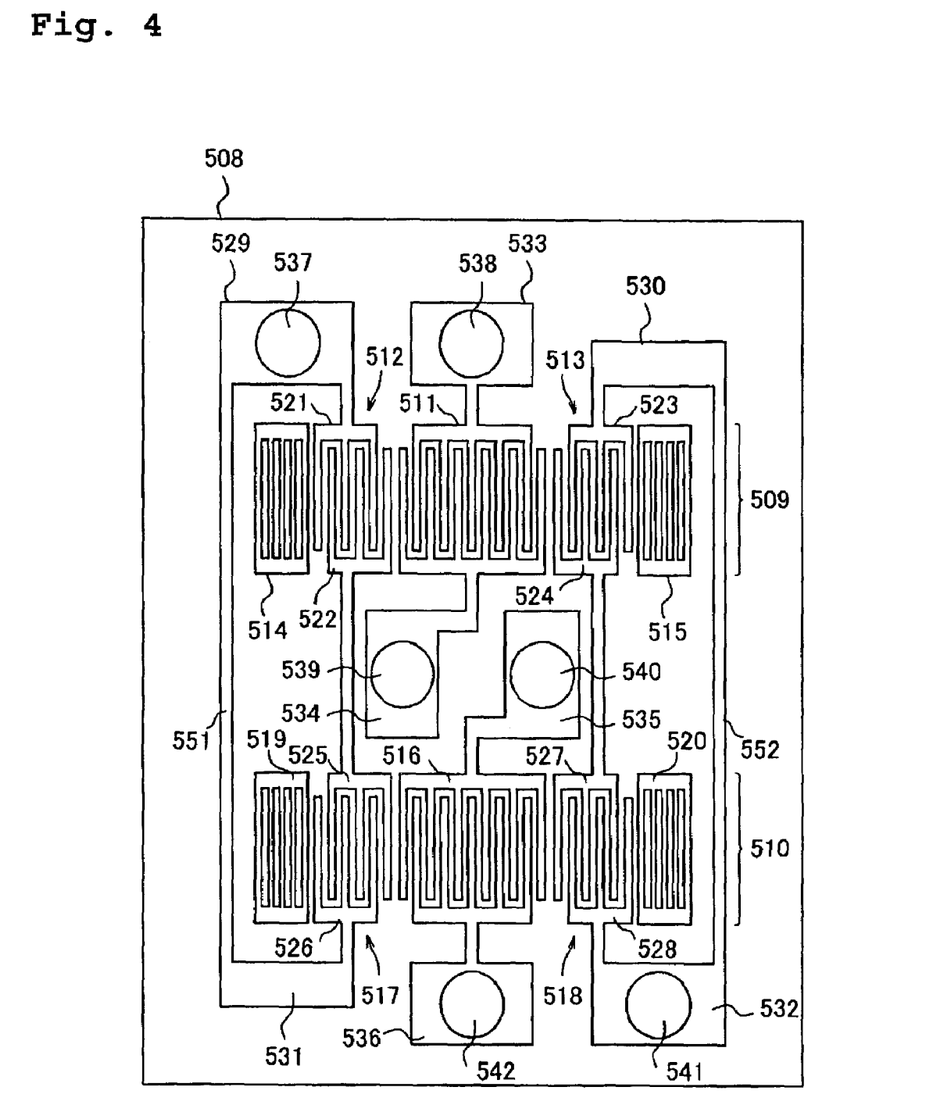
FIG. 4 is a schematic view showing a surface acoustic wave apparatus according to a fourth preferred embodiment of the present invention.

In the following, description will be provided to explain a surface acoustic wave apparatus according to a fourth preferred embodiment of the present invention. In fact, the fourth preferred embodiment represents a surface acoustic wave apparatus in which the electrodes of the surface acoustic wave filter of the third preferred embodiment are connected with the electrodes of the package not through the metal wires but through a flip-chip manner using metal bumps. FIG. 4 shows the fourth preferred embodiment, but without showing the package.

Actually, in the fourth preferred embodiment, by using the same connection method as used in the third preferred embodiment using metal wires, an unbalanced signal terminal 533 of a first surface acoustic wave filter 509 is connected via a metal bump to a diaphragm contact surface connected with an unbalanced signal electrode of the package. On the other hand, various balanced signal terminals 535 and 536 of a second surface acoustic wave filter 510 are also connected via the metal bumps to a diaphragm contact surface connected with a balanced signal electrode of the package.

Further, a reference terminal 529 and a reference terminal 532 are connected via the metal bumps to the diaphragm contact surface connected with the ground electrodes of the package, while the ground terminal 534 of an IDT 511 of the first surface acoustic wave filter 509 is connected via a metal bump to a diaphragm contact surface connected with a balanced side ground electrode of the package.

By using the flip-chip method using the metal bumps described above, it is possible for the diaphragm contact surfaces, frets and the like of the package to provide the same effect as obtainable from the above-described metal wires, thereby improving an attenuation outside the pass bands.

Figure 11:
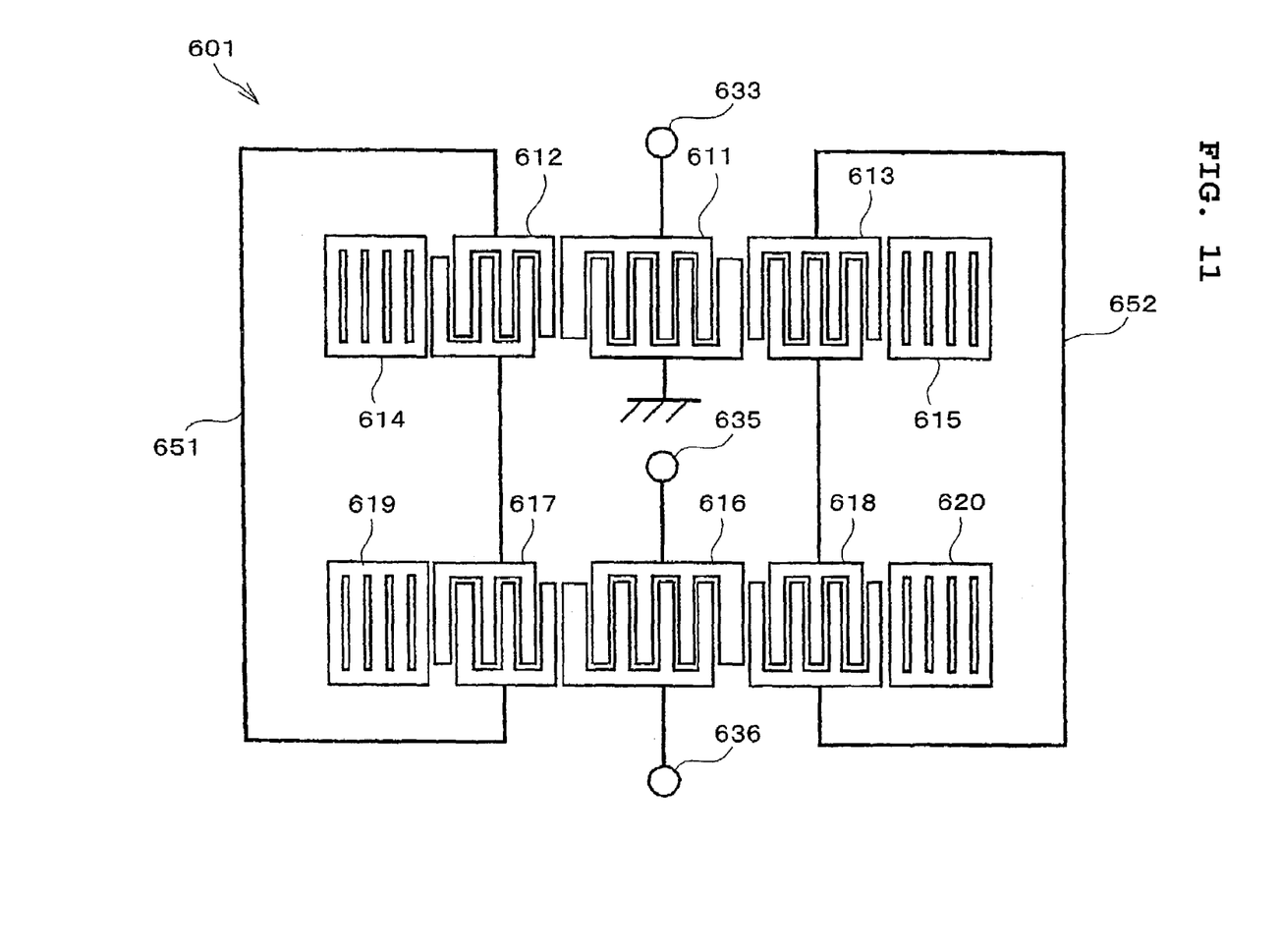
FIG. 11 is a schematic view showing a surface acoustic wave apparatus according to a fifth preferred embodiment of the present invention.

In the following, description will be provided to explain a surface acoustic wave apparatus according to a fifth preferred embodiment of the present invention. Similar to each of the above-described preferred embodiments, the fifth preferred embodiment, as shown in FIG. 11, has a structure capable of performing float connection, such that the total number of electrode fingers of each of the IDTs 611 and 616 in the central area is an even number, thereby improving the characteristic outside the pass bands.

Here, the fifth preferred embodiment is described using an AMPS receiving filter as an example. More specifically, in the fifth preferred embodiment, IDTs 612 and 617 on one side with respect to the respective central IDTs 611 and 616 are connected with each other, but not in a grounded connection. Further, IDTs 613 and 618 on the other side of the central IDTs are also connected with each other, but not in a grounded connection. In other words, the IDTs 612 and 617 are connected with each other by a floating connection, while the IDTs 613 and 618 are connected with each other also by a floating connection. However, a piezoelectric substrate is not shown in the drawing.

Here, the number of electrode fingers of the central IDTs 611 and 616 is preferably an even number, while the IDTs 617 and 618 are connected in a manner such that their phases are mutually opposite to each other. By virtue of such an arrangement, it is possible to improve an amplitude balance and a phase balance outside the pass bands, as well as to achieve a balun function.

Further, in the fifth preferred embodiment, it is preferable that the pitch of the outermost electrode fingers of the central IDTs 611 and 616 is changed to a pitch of other electrode fingers, for example, is set to be large.

Although in the above-described first to fifth preferred embodiments, a 40±5 degree Y-cut X-propagation LiTaO₃ substrate is preferably used, the substrate is not limited thereto. In fact, it is also possible to use some other substrates such as a 64–72 degree Y-cut X-propagation LiNbO₃ substrate and a 41 degree Y-cut X-propagation LiNbO₃ substrate, thereby obtaining the same effects. Further, in order to obtain a desired frequency characteristic, it is possible to optionally make some changes in the cross width, the number of IDTs, an IDT-IDT interval, an IDT-reflector interval, and even to add a trap if necessary, thereby obtaining the same effects.

Thus, according to a surface acoustic wave apparatus of various preferred embodiments of the present invention, as described above, a piezoelectric substrate has at least two longitudinally connected surface acoustic wave filters arranged thereon to provide a balun function, which filters have several groups of IDTs arranged in the propagating direction of a surface acoustic wave. Further provided on the piezoelectric substrate are wiring patterns for mutually electrically connecting reference terminal side electrode fingers corresponding to the electric terminal side electrode fingers which are mutually electrically connected on the IDTs for electric signals to flow therethrough.

In addition, with the use of the above arrangement, if the wiring patterns are provided, it is possible to dispense with some connections such as metal wires which were needed in the conventional apparatuses, thereby simplifying the structure of the apparatus. In addition, it is possible to improve an attenuation outside the pass bands, as compared with the conventional apparatus.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave apparatus comprising:
   a piezoelectric substrate;
   at least two longitudinally connected surface acoustic wave filters provided on the piezoelectric substrate for providing a balun function, said filters having a plurality of comb-like electrode sections arranged in a propagating direction of a surface acoustic wave; and
   wiring patterns provided on the piezoelectric substrate to directly and mutually electrically connect reference terminal side electrode fingers other than electric terminal side electrode fingers of at least one of the plurality of comb-like electrode sections of one of the at least two surface acoustic wave filters to reference terminal side electrode fingers other than electric terminal side electrode fingers of at least one of the plurality of comb-like electrode sections of another of the at least two surface acoustic wave filters for electric signals to flow therethrough; wherein
   said wiring patterns are not grounded.

2. A surface acoustic wave apparatus according to claim 1, wherein the respective comb-like electrode sections are electrically separated from one another on the piezoelectric substrate, and provided with electric terminal side electrode fingers and reference terminal side electrode fingers which are connected with the electrodes on a next stage, wherein the respective electric terminal side electrode fingers are electrically connected with one another on the piezoelectric substrate, and the wiring patterns are provided on the piezoelectric substrate to mutually electrically connect the respective reference terminal side electrode fingers corresponding to the respective electric terminal side electrode fingers electrically connected with one another.

3. A surface acoustic wave apparatus according to claim 1, wherein a package for receiving the piezoelectric substrate is provided such that at least one ground electrode is disposed between balanced signal electrodes and along edge portions of the package, a signal connecting section is provided for electrically connecting the respective balanced signal terminals on the piezoelectric substrate and the respective balanced signal terminals on the package, a ground connecting section is provided for connecting a ground terminal of the reference terminal side electrode fingers corresponding to the comb-like electrode sections connected with unbalanced signal terminals, and said at least one ground electrode located between the balanced signal electrodes on the package.

4. A surface acoustic wave apparatus according to claim 3, wherein the ground terminal with respect to the unbalanced signal terminal of one of the at least two surface acoustic wave filters is connected with the balanced side ground electrode of the package via a metal wire.

5. A surface acoustic wave apparatus according to claim 3, wherein an unbalanced signal terminal of one of the at least two surface acoustic wave lifters is connected via a metal bump to a diaphragm contact surface connected with an unbalanced signal electrode of the package.

6. A surface acoustic wave apparatus according to claim 5, wherein balanced signal terminals of the other of the at least two surface acoustic wave filters are connected via metal bumps to the diaphragm contact surface connected with a balanced signal electrode of the package.

7. A surface acoustic wave apparatus according to claim 6, wherein ground terminals of the one of the at least two surface acoustic wave filters is connected via another metal bump to the diaphragm contact surface connected with a balanced side ground electrode of the package.

8. A surface acoustic wave apparatus according to claim 1, wherein at least one of the plurality of comb-like electrode sections of each of the at least two surface acoustic wave filters longitudinally connect the at least two surface acoustic wave filters together, wherein the at least one of the plurality of comb-like electrode sections of each of the at least two surface acoustic wave filters which longitudinally connect the at least two surface acoustic wave filters together are separated from each other along the piezoelectric substrate.

9. A surface acoustic wave apparatus according to claim 1, wherein the at least two surface acoustic wave filters include longitudinally connected electric terminals which are arranged to longitudinally connect the at least two surface acoustic wave filters together, and reference terminals corresponding to the longitudinally connected electric terminals, wherein the reference terminals are respectively electrically connected with one another on the piezoelectric substrate via at least one of the wiring patterns.

10. A surface acoustic wave apparatus according to claim 1, wherein the at least two surface acoustic wave filters include longitudinally connected electric terminals which are arranged to longitudinally connect the at least two surface acoustic wave filters together, and reference terminals corresponding to the longitudinally connected electric terminals, wherein the reference terminals are respectively electrically connected with one another on the piezoelectric substrate via respective ones of the wiring patterns.

11. A surface acoustic wave apparatus according to claim 1, wherein the surface acoustic wave filters are arranged in two longitudinally connected stages.

12. A surface acoustic wave apparatus according to claim 1, wherein the at least two surface acoustic wave filters are arranged on the piezoelectric substrate such that their surface acoustic wave propagating directions are substantially parallel with each other, and such that center positions of the surface acoustic wave propagating directions are substantially coincident with each other in a direction that is substantially perpendicular to the propagating direction of the surface acoustic wave.

13. A surface acoustic wave apparatus according to claim 1, wherein the wiring patterns are arranged on the piezoelectric substrate symmetrically with respect to one another.

14. A surface acoustic wave apparatus according to claim 1, wherein the piezoelectric substrate is one of a 40±5 degree Y-cut X-propagation LiTaO$_3$ substrate, a 64–72 degree Y-cut X-propagation LiNbO$_3$ substrate and a 41 degree Y-cut X-propagation LiNbO$_3$ substrate.

15. A surface acoustic wave apparatus comprising:
a piezoelectric substrate;
at least two longitudinally connected surface acoustic wave filters provided on the piezoelectric substrate for providing a balun function, said filters having a plurality of comb-like electrode sections arranged in a propagating direction of a surface acoustic wave; and
wiring patterns provided on the piezoelectric substrate to directly and mutually electrically connect reference terminal side electrode fingers other than electric terminal side electrode fingers of at least one of the plurality of comb-like electrode sections of one of the at least two surface acoustic wave filters to reference terminal side electrode fingers other than electric terminal side electrode fingers of at least one of the plurality of comb-like electrode sections of another of the at least two surface acoustic wave filters for electric signals to flow therethrough; wherein a package for receiving the piezoelectric substrate is provided, said package includes ground electrodes arranged such that at least one of said ground electrodes is disposed between balanced signal electrodes and along edge portions of the package, a signal connecting section is provided for electrically connecting the respective balanced signal terminals on the piezoelectric substrate and the respective balanced signal terminals on the package, a ground connecting section is provided for connecting a ground terminal of the reference terminal side electrode fingers corresponding to the comb-like electrode sections connected with unbalanced signal terminals, and said at least one of said ground electrodes located between the balanced signal electrodes on the package; and the wiring patterns on the piezoelectric substrate to mutually electrically connect the respective reference terminal side electrode fingers corresponding to the respective electric terminal side electrode fingers electrically connected with one another, are electrically connected with separate ones of the ground electrodes of the package.

16. A surface acoustic wave apparatus comprising:
a piezoelectric substrate;
at least two longitudinally connected surface acoustic wave filters provided on the piezoelectric substrate for providing a balun function, said filters having a plurality of comb-like electrode sections arranged in a propagating direction of a surface acoustic wave; and
wiring patterns provided on the piezoelectric substrate to directly and mutually electrically connect reference terminal side electrode fingers other than electric terminal side electrode fingers of at least one of the plurality of comb-like electrode sections of one of the at least two surface acoustic wave filters to reference terminal side electrode fingers other than electric terminal side electrode fingers of at least one of the plurality of comb-like electrode sections of another of the at least two surface acoustic wave filters for electric signals to flow therethrough; wherein a package for receiving the piezoelectric substrate is provided such that at least one ground electrode is disposed between balanced signal electrodes and along edge portions of the package, a signal connecting section is provided for electrically connecting the respective balanced signal terminals on the piezoelectric substrate and the respective balanced signal terminals on the package, a ground connecting section is provided for connecting a ground terminal of the reference terminal side electrode fingers corresponding to the comb-like electrode sections connected with unbalanced signal terminals, and said at least one ground electrode located between the balanced signal electrodes on the package; and the ground terminal with respect to the unbalanced signal terminal of one of the at least two surface acoustic wave filters is connected with the balanced side ground electrode of the package via a metal wire.

* * * * *